United States Patent [19]
Swindlehurst et al.

[11] Patent Number: 6,085,968
[45] Date of Patent: Jul. 11, 2000

[54] SOLDER RETENTION RING FOR IMPROVED SOLDER BUMP FORMATION

[75] Inventors: Susan J. Swindlehurst, Redwood City; Hubert A. Vander Plas, Palo Alto; Jacques Leibovitz, San Jose, all of Calif.

[73] Assignee: Hewlett-Packard Company, Palo Alto, Calif.

[21] Appl. No.: 09/235,579

[22] Filed: Jan. 22, 1999

[51] Int. Cl.[7] .............. B23K 35/14; B23K 31/02; H01L 21/441
[52] U.S. Cl. .............. 228/254; 228/215; 228/248.1; 438/612; 438/613
[58] Field of Search .............. 228/118, 180.22, 228/245, 246, 247, 248.1, 248.5, 249, 250, 251, 252, 253, 254, 124.6, 215, 216; 438/612, 613

[56] References Cited

U.S. PATENT DOCUMENTS

| | | | |
|---|---|---|---|
| 5,024,372 | 6/1991 | Altman et al. | 228/248 |
| 5,436,198 | 7/1995 | Shibata | 437/183 |
| 5,449,108 | 9/1995 | Park | 228/103 |
| 5,478,700 | 12/1995 | Gaynes et al. | 430/315 |
| 5,492,266 | 2/1996 | Hoebener et al. | 228/248.1 |
| 5,539,153 | 7/1996 | Schwiebert et al. | 174/260 |
| 5,587,342 | 12/1996 | Lin et al. | 437/209 |
| 5,660,321 | 8/1997 | Ishida et al. | 228/248.1 |
| 5,736,456 | 4/1998 | Akram | 438/614 |
| 5,738,269 | 4/1998 | Masterton | 228/248.1 |
| 5,762,259 | 6/1998 | Hubacher et al. | 228/180.22 |
| 5,803,340 | 9/1998 | Yeh et al. | 228/56.3 |
| 5,892,179 | 4/1999 | Rinne et al. | 174/261 |
| 5,903,058 | 5/1999 | Akram | 257/778 |
| 6,008,071 | 12/1999 | Karasawa et al. | 438/115 |
| 6,020,561 | 2/2000 | Ishida et al. | 174/261 |

*Primary Examiner*—Gregory Mills
*Assistant Examiner*—Kiley Stoner
*Attorney, Agent, or Firm*—Brian R. Short

[57] ABSTRACT

A method of forming solder bumps on a wafer. The wafer includes at least one substrate, a plurality of solder-wettable pads and a solder wettable retention ring about the periphery of the wafer. The method of forming solder bumps includes forming a non-solder-wettable mask on the wafer which includes a plurality of apertures which align with the solder-wettable pads, and the solder wettable retention ring surrounds the mask. The mask and wafer are positioned within an aperture of a stencil so that the solder wettable retention ring aligns with a gap between the periphery edge of the mask and an inside edge of the aperture of the stencil. Solder paste is applied to the mask so that the solder paste fills the apertures of the mask and the gap. The solder paste is reflowed forming solder bumps on the pads and a solder ring on the solder wettable retention ring. The mask is removed after formation of the solder bumps.

5 Claims, 6 Drawing Sheets

SOLDER RETENTION RING FOR IMPROVED SOLDER BUMP FORMATION

FIELD OF INVENTION

This invention relates generally to solder bump formation. In particular, it relates to a method for improved solder bump formation on an integrated circuit wafer through the use of a solder retention ring formed on the wafer.

BACKGROUND

Various methods for electrically connecting bare die integrated circuits to printed circuit substrates are well known in the art. Among the methods of connecting integrated circuits to mated circuit substrates, the technique of flip chip with solder bumps has the most promise with regard to electrical performance, size reduction and price. A flip chip is an integrated circuit chip in which the bonding pads have solder bumps formed on them. Solder bumps are approximately truncated spheres of solidified solder attached to the bonding pads and are typically of a tin-lead composition. The flip chip does not have a plastic shell or metallic leads common to most integrated circuit packages. The active side of the flip chip contains the active devices and bonding pads, and has a passivation layer with apertures, that protects the chip's active components from environmental contaminants. The solder bumps of the flip chip are positioned in registering contact with the substrate circuit conductive contact areas and metallurgically joined to the conductive contact areas during reflow.

Flip chip technology offers a number of advantages over standard wirebonded integrated circuits. Flip chips are generally smaller than wirebonded integrated circuits and require smaller circuit board area. Additionally, flip chips allow for more inputs/outputs (I/Os) than wirebonded integrated circuits.

There are various methods for forming solder bumps. Formation methods include evaporation, electroplating and stencil printing. Each of these methods include limitations. Much research has been performed to overcome the limitations of these methods.

FIG. 1 shows a flip chip substrate 110 in which solder bumps are to be formed on solder-wettable pads 120 of the substrate 110. The solder-wettable pads 120 are formed from an under bumping material deposited over substrate bond pads 140. Typically, the flip chip substrate 110 includes a passivation layer 130. Generally, solder is deposited on the solder-wettable pads 120, and reflowed to form solder bumps on the solder-wettable pads 120.

FIG. 2 shows a flip chip substrate 110 which includes a polymeric mask 210 formed over the flip chip substrate 110. The mask 210 includes apertures 220 which align with the solder-wettable pads 120. Solder paste can be deposited in the apertures 220 of the mask 210. Solder paste is a mixture of solder spheres and a flux vehicle that contains flux and other organic Theological agents. The solder paste is typically 50% solder by volume. The solder paste is then reflowed, forming solder bumps within the apertures 220. The solder bumps are electrically and metallurgically connected to the solder-wettable pads 120.

FIG. 3 illustrates a stencil printing process used to deposit solder paste within the apertures 220 of the mask 210. Here, the mask 210 has been formed on a wafer 330 which includes many flip chip substrates. To deposit the solder paste within the apertures 220 of the mask 210, the mask 210 and the wafer 330 are placed within a printing stencil 310. Some of the solder paste 320 is then "squeegeed" into apertures 220 of the mask 210. The apertures 220 are not shown in FIG. 3. After some of the solder paste 320 has been deposited within the apertures 220 during the squeegee process, the solder paste within the apertures is heated which reflows the solder paste within the apertures forming solder bumps.

FIG. 3 illustrates that due to required alignment tolerances, a gap 340 between the edge of the stencil 310 and the edge of the mask 210 will always exist. During the squeegee process, some of the solder paste 320 will be printed into the gap 340 between the mask 210 and the stencil 310. Excess solder paste 350 must be cleaned from the gap 340 before reflowing the solder paste in the apertures.

If the excess solder paste 350 is not cleaned off, then during reflow of the solder paste in the apertures, the excess solder paste 350 will turn into molten solder balls which can join with the solder bumps being formed causing defects to the flip chip substrate 110 (wafer). In addition, the molten solder balls can form on the side of the wafer 330. The process of cleaning the solder paste is time consuming and adds expense to the solder bump formation process.

It is desirable to have a method of forming solder bumps on a wafer in which a processing step for cleaning excess solder from the wafer is not required.

SUMMARY OF THE INVENTION

The present invention is a method of forming solder bumps. The method includes forming solder bumps on a wafer in which a step for cleaning excess solder from a gap between a mask of the wafer and an aperture of a stencil which receives the mask and wafer is not required.

A first embodiment of this invention includes a method of forming solder bumps on a wafer. The wafer includes at least one substrate, a plurality of solder-wettable pads and a solder wettable retention ring at the periphery of the wafer. The method of forming solder bumps includes forming a non-solder-wettable mask on the wafer which includes a plurality of apertures which align with the solder-wettable pads. The mask is formed so that the solder wettable retention ring surrounds the mask. The mask and wafer are positioned within an aperture of a stencil so that the solder wettable retention ring aligns with a gap between the periphery edge of the mask and an inside edge of the aperture of the stencil. Solder paste is applied to the mask so that the solder paste fills the apertures of the mask and the gap. The solder paste is reflowed forming solder bumps on the pads and a solder ring on the solder wettable retention ring. The mask is removed after formation of the solder bumps.

A second embodiment of this invention is similar to the first embodiment. The second embodiment includes the solder paste being reflowed to form a non-continuous solder ring on the solder wettable retention ring.

Other aspects and advantages of the present invention will become apparent from the following detailed description, taken in conjunction with the accompanying drawings, illustrating by way of example the principles of the invention.

DETAILED DESCRIPTION

Figure 1:
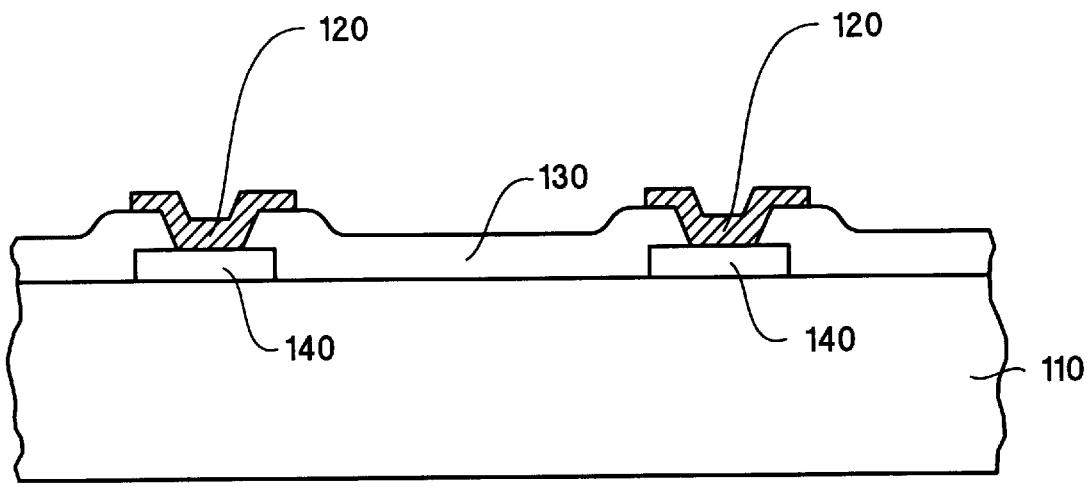
FIG. 1 shows a flip chip substrate in which solder bumps are to be formed on solder-wettable pads of the substrate.
Figure 2:
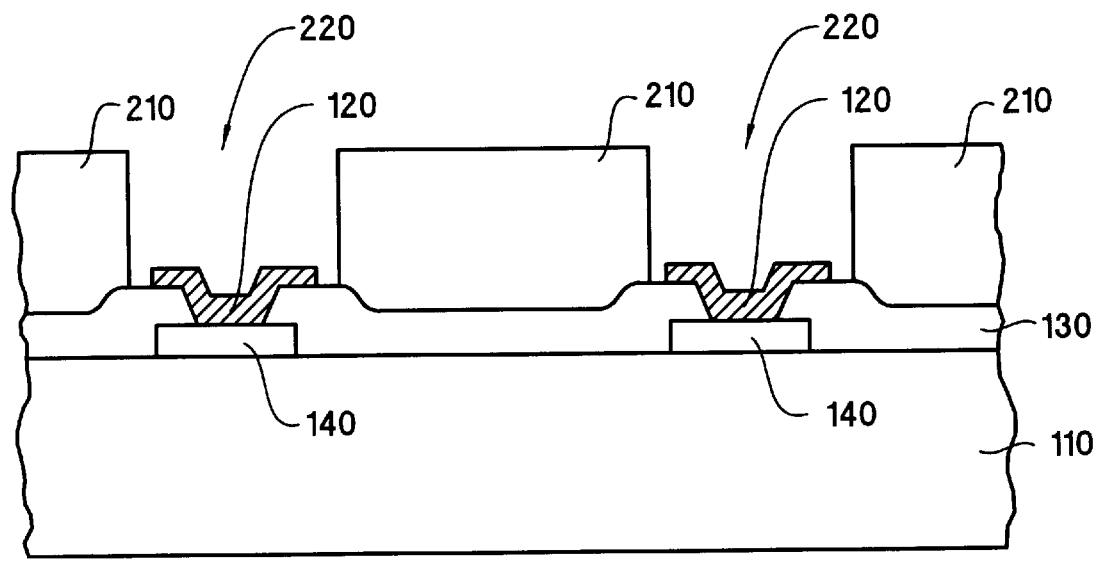
FIG. 2 shows the flip chip substrate of FIG. 1 in which a mask has been formed over the substrate and the mask includes apertures which align with the solder-wettable pads of the substrate.
Figure 3:
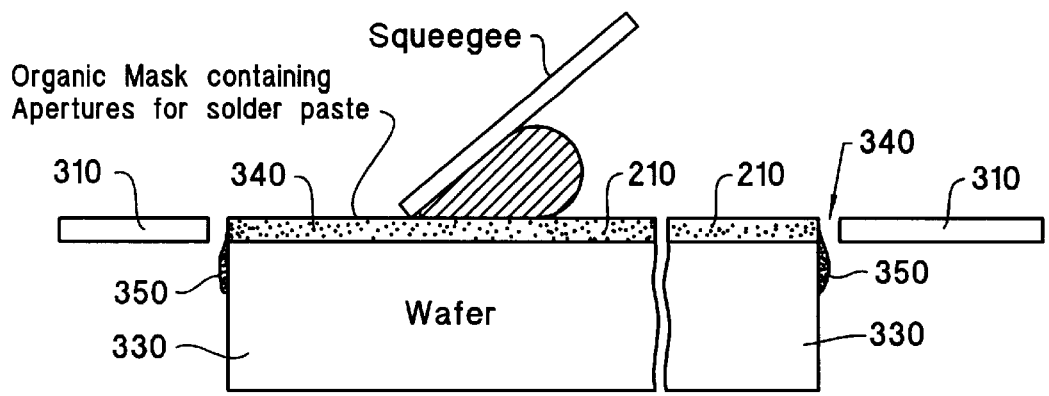
FIG. 3 shows a method of depositing solder paste within the apertures of the mask formed on the substrate.

As shown in the drawings for purposes of illustration, the invention is embodied in a method of forming solder bumps on a wafer in which a step for cleaning excess solder between a mask of the wafer and an aperture of a stencil which receives the mask and wafer is not required.

Figure 4:
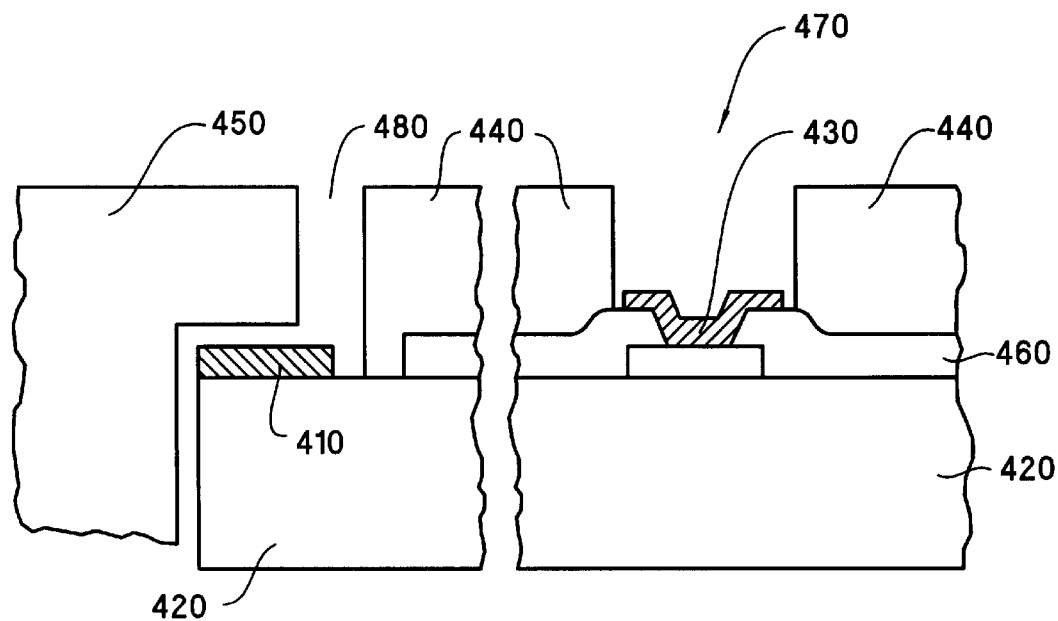
FIG. 4 shows an embodiment of the invention including a solder retention ring corresponding with a gap between a mask formed on the surface of an integrated circuit wafer and a printing stencil which receives the mask and the wafer.

FIG. 4 shows an embodiment of the invention. This embodiment includes a solder retention ring 410 formed on a surface of an integrated circuit wafer 420. Also formed on the surface of the integrated circuit wafer 420 are solder-wettable pads 430. The solder retention ring 410 is formed about the periphery of the wafer 420. A mask 440 is formed on the wafer 420 which includes apertures 470 which align with solder-wettable pads 430. The mask 440 does not extend to the edge of the wafer 420. The solder retention ring 410 surrounds an outer edge of the mask 440. A clearance exists between the mask and the solder retention ring 410. Generally, the surface of the wafer 420 includes a passivation layer 460.

The solder retention ring 410 is formed on the surface of the integrated circuit wafer 420 at the same time the solder-wettable pads 430 are formed. In addition, the solder retention ring 410 is formed using the same processing steps as the solder-wettable pads 430. Therefore, formation of the solder retention ring 410 does not require any extra processing steps.

To deposit solder paste within the apertures 470 of the mask 440, the mask 440 and the wafer 420 are placed within a stencil 450. The stencil 450 of FIG. 4 includes a stepped shape edge which receives an edge of the wafer 420. When the mask 440 and the wafer 420 are placed within the stencil 450, a gap 480 due to alignment tolerances exists between the stencil 450 and the mask 440. The solder retention ring 410 aligns with the gap 480.

Figure 5:
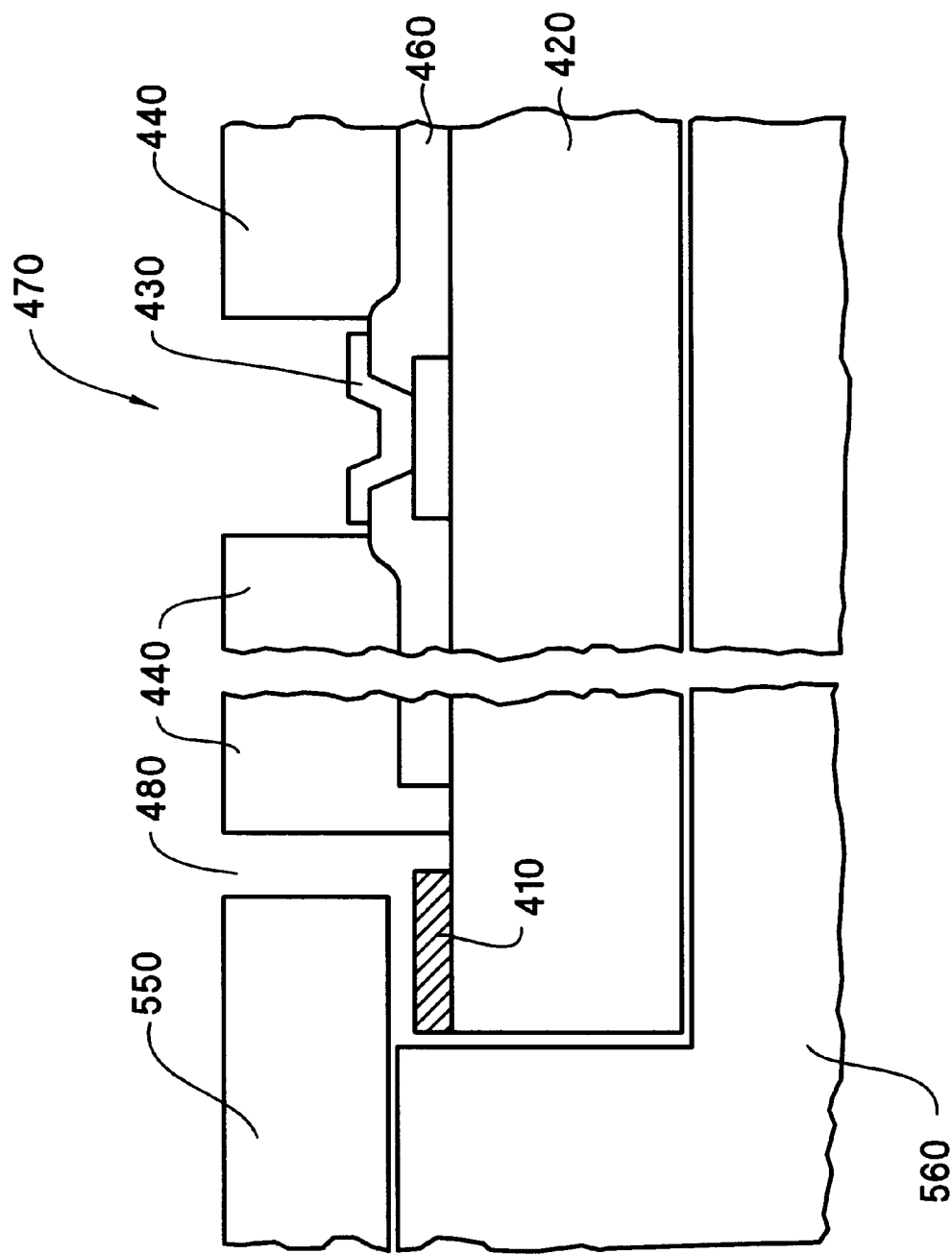
FIG. 5 shows another embodiment of the invention including a solder retention ring corresponding with a gap between a mask formed on the surface of an integrated circuit wafer and a printing stencil which receives the mask and the wafer.

FIG. 5 shows another embodiment of the invention including a solder retention ring 410 corresponding with a gap 480 between a mask 440 formed on the surface of an integrated circuit wafer 420 and a printing stencil 550 which receives the mask 440 and the wafer 420. The stencil 550 of FIG. 5 does not include the stepped edge for receiving the wafer 420 like the stencil 450 of FIG. 4. The embodiment of FIG. 5 includes a wafer holder 560 which holds the wafer 420 up against the stencil 550. Like the embodiment of FIG. 4, this embodiment includes gap 480 due to alignment tolerances exists between the stencil 450 and the mask 440. The solder retention ring 410 aligns with the gap 480.

Figure 6:
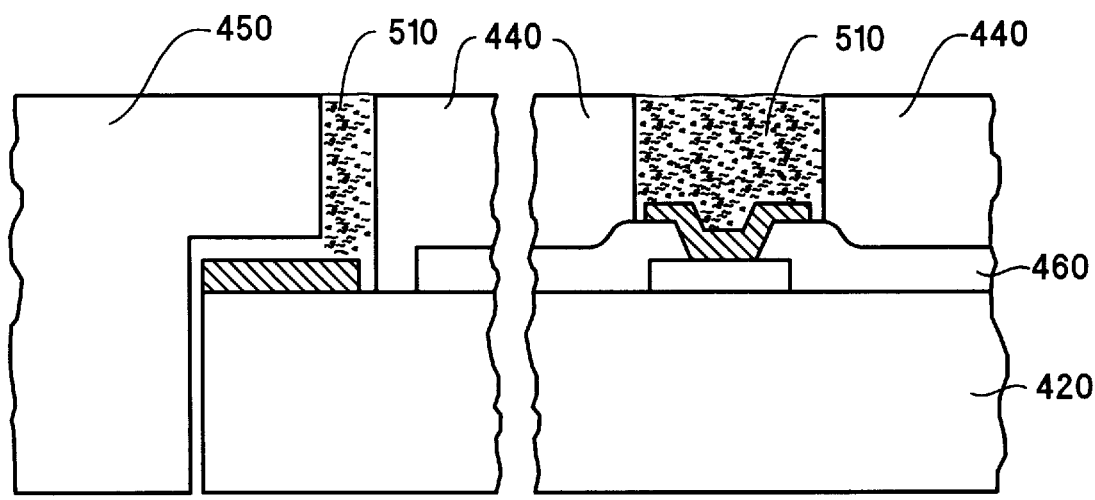
FIG. 6 shows the embodiment of FIG. 4 in which the gap and apertures in the mask have been filled with solder paste.

FIG. 6 shows the embodiment of FIG. 4 in which the gap 480 and apertures 470 in the mask 440 have been filled with solder paste 510. Generally, the solder paste 510 is squeegeed into the gap 480 and the apertures 470. However, other method of depositing the solder paste 510 may be used.

Figure 7:
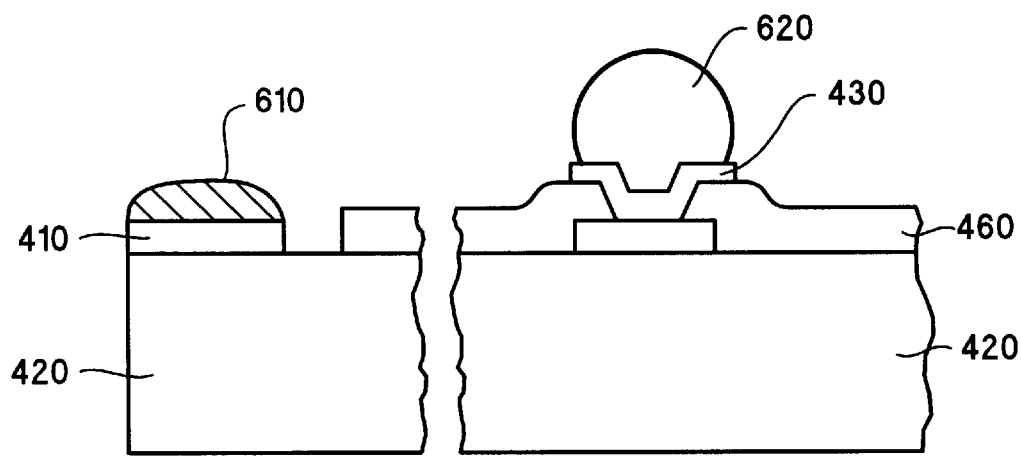
FIG. 7 shows the embodiment of FIG. 5 in which the solder paste has been reflowed forming a solder ring over the solder retention ring and forming solder bumps over solder-wettable pads of the wafer.

FIG. 7 shows the embodiment of FIG. 5 in which the solder paste 510 has been reflowed forming a solder ring 610 over the solder retention ring 410 and forming solder bumps 620 over the solder-wettable pads 430 of the wafer 420. The solder ring 610 encompasses the periphery of the wafer 420 according to the solder retention ring 410, while the solder bumps 620 are restricted to the surface areas of the solder-wettable pads 430.

Figure 8:
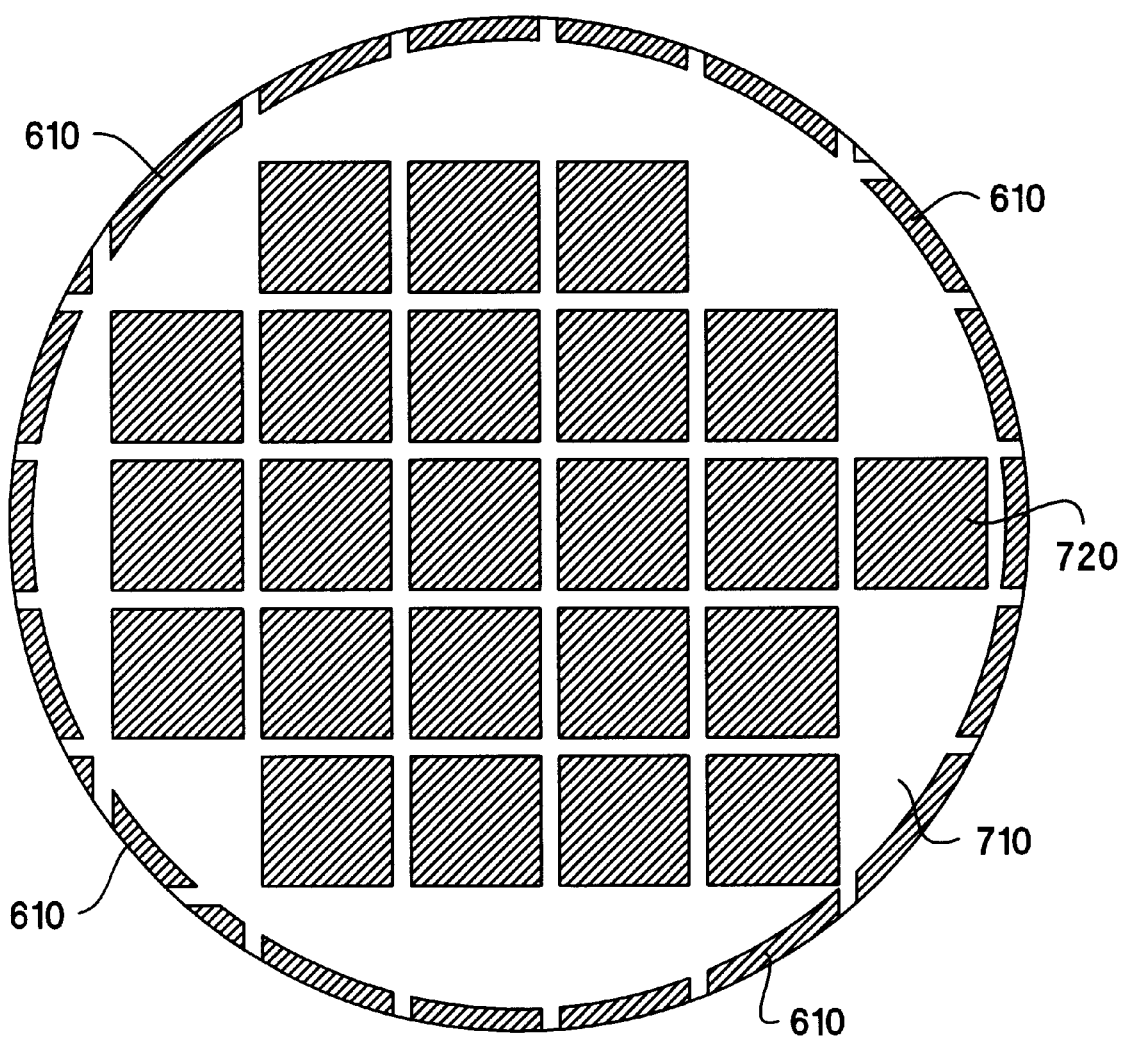
FIG. 8 shows a top-view of a wafer including a solder retention ring according to the invention.

FIG. 8 shows a top-view of a wafer 710 including a solder ring 730 according to the invention. Again, the solder ring 730 encompasses the periphery of the wafer 710. Many integrated circuit substrates 720 of the wafer 710 can be included within the solder ring 730. This embodiment further includes the solder ring 730 having several individual sections. A sectional, non-continuous solder retention ring provides for the formation of a sectional or non-continuous solder ring 730. The gaps is the solder retention ring align with scribe lines on the wafer. The non-continuous feature of the solder ring 730 allows the wafer 710 to be sectioned into pieces more easily. That is, the wafer can be sectioned without having to cut through the solder ring. Cuts (dicing) of the wafer can be made between the solder ring sections.

Figure 9:
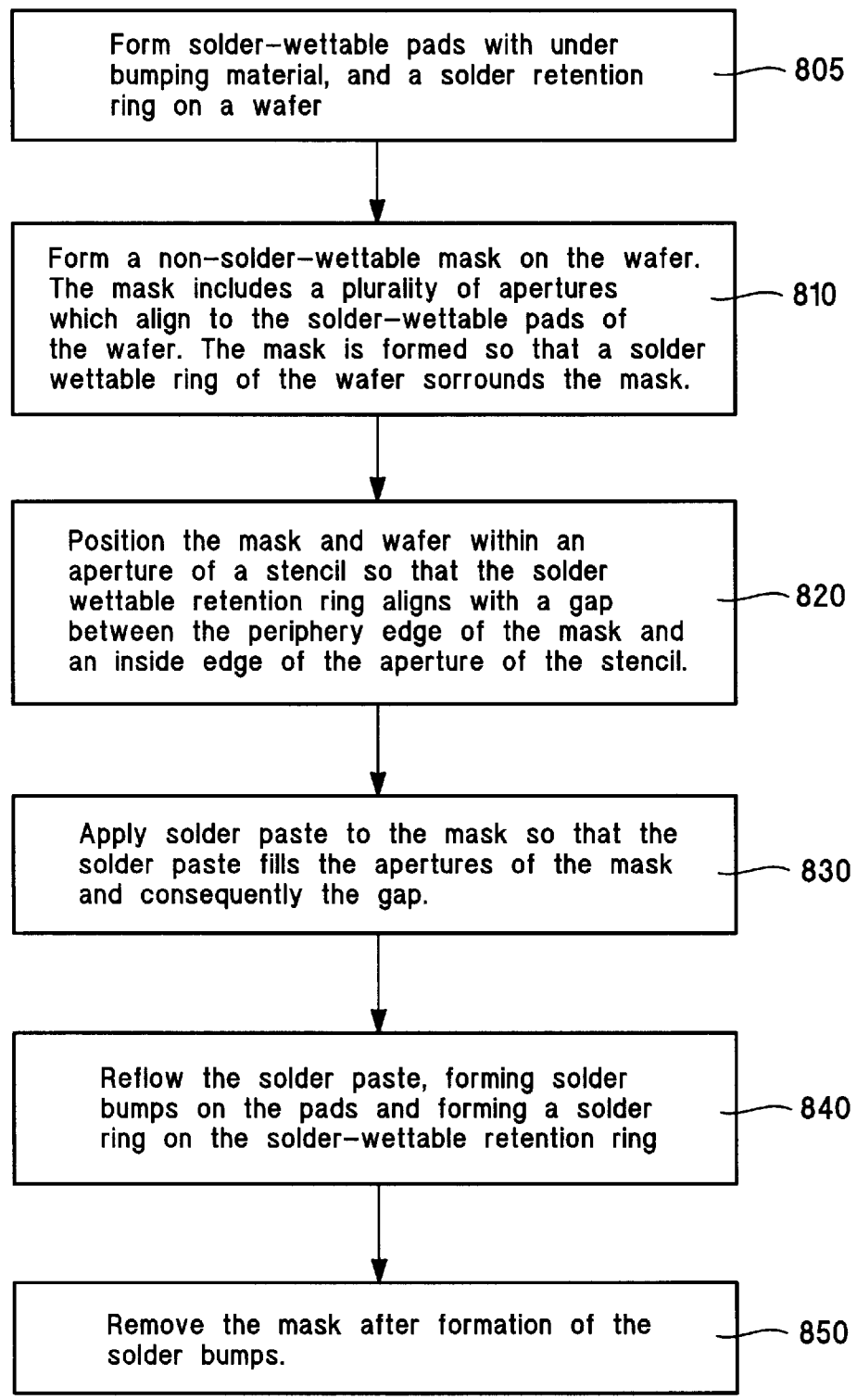
FIG. 9 is a flow chart showing the steps of a method of forming solder bumps according to the invention.

FIG. 9 is a flow chart depicting steps of a method of forming solder bumps on a wafer which includes solder-wettable pads and a solder wettable retention ring, according to the invention.

A first step 805 includes forming solder-wettable pads with under bumping material, and a solder wettable retention ring on a wafer.

A second step 810 includes forming a non-solder-wettable mask on the wafer. The mask includes a plurality of apertures which align with the solder-wettable pads. The mask is formed so that the solder wettable retention ring surrounds the mask. The mask can be formed from a photosensitive polymeric film. The shape and pattern of the apertures of the mask are photo-lithographically defined.

A third step 820 includes positioning the mask and wafer within an aperture of a stencil so that the solder wettable retention ring aligns with a gap between the periphery edge of the mask and an inside edge of the aperture of the stencil. The solder retention ring is designed as part of the wafer "tooling." Therefore, a single stencil design can be used for all wafer designs. The stencil design is independent of the wafer pattern.

A fourth step 830 includes applying solder paste to the mask so that the solder paste fills the apertures of the mask and the gap. The solder paste includes a uniform, stable suspension of metal powder in a flux vehicle. The flux vehicle contains the flux and other constituents that determine the solder paste performance during the stencil printing and reflow process. The solder paste is generally deposited by squeegeeing the solder paste as previously described. However, the solder paste can also be deposited by dispensing an appropriate volume of solder paste at each individual aperture.

A fifth step 840 includes reflowing the solder paste forming solder bumps on the pads and forming a solder ring on the solder wettable retention ring. The solder wettable retention ring is typically non-continuous. Therefore, the solder ring is non-continuous. The non-continuous portions of the solder ring can be placed where the wafer is to be cut.

A sixth step 850 includes removing the mask after formation of the solder bumps and the solder ring.

Although specific embodiments of the invention have been described and illustrated, the invention is not to be limited to the specific forms or arrangements of parts so described and illustrated. The invention is limited only by the claims.

What is claimed is:

1. A method of forming solder bumps on a wafer, the wafer comprising at least one substrate, a plurality of solder-wettable pads, and a solder-wettable retention ring about the periphery of the wafer, the method comprising:

a. forming a non-solder-wettable mask on the wafer which includes a plurality of apertures which align with the solder-wettable pads, the solder-wettable retention ring surrounding the mask;

b. positioning the mask and wafer within an aperture of a stencil so that the solder-wettable retention ring aligns with a gap between the periphery edge of the mask and an inside edge of the aperture of the stencil;

c. applying solder paste to the mask so that the solder paste fills the apertures of the mask and the gap;

d. reflowing the solder paste forming solder bumps on the pads and forming a solder ring on the solder-wettable retention ring; and e. removing the mask after formation of the solder bumps.

2. The method of forming solder bumps on a wafer of claim 1, wherein the solder retention ring is non-continuous and reflowing the solder paste forms a non-continuous solder ring on the non-continuous solder-wettable retention ring.

3. The method of forming solder bumps on a wafer of claim 1, wherein step a comprises forming a photo-sensitive polymeric film mask on the wafer which includes a plurality of apertures which align with the solder-wettable pads, the solder-wettable retention ring surrounding the mask.

4. The method of forming solder bumps on a wafer of claim 1, wherein step c comprises squeegeeing solder paste to the mask so that the solder paste fills the apertures of the mask and the gap.

5. The method of forming solder bumps on a wafer of claim 2, further comprising the step of cutting the wafer between non-continuous portions of the non-continuous solder ring.

* * * * *